United States Patent
Tan et al.

(10) Patent No.: US 6,806,658 B2
(45) Date of Patent: Oct. 19, 2004

(54) METHOD FOR MAKING AN LED

(75) Inventors: Kheng Leng Tan, Taman Bukit Jambul (MY); Abdul Karim Aizar, Pan Mayang Pasir (MY); Su Lin Oon, Penang (MY); Boon Chun Tan, Tanjong Bungah (MY)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/383,443

(22) Filed: Mar. 7, 2003

(65) Prior Publication Data

US 2004/0183471 A1 Sep. 23, 2004

(51) Int. Cl.$^7$ .......................... H05B 37/02; H01L 29/22
(52) U.S. Cl. .......................... 315/291; 257/98
(58) Field of Search .................. 315/291; 313/501, 313/502, 503, 467, 486; 257/79, 81, 98, 99, 100, 463; H05B 37/02; H01L 29/22

(56) References Cited

U.S. PATENT DOCUMENTS

| | | | | |
|---|---|---|---|---|
| 6,066,861 A | * | 5/2000 | Hohn et al. .................. 257/99 |
| 6,245,259 B1 | * | 6/2001 | Hohn et al. ............ 252/301.36 |
| 6,635,363 B1 | * | 10/2003 | Duclos et al. .............. 428/690 |
| 2002/0167014 A1 | * | 11/2002 | Schlereth et al. ............. 257/79 |

* cited by examiner

*Primary Examiner*—Don Wong
*Assistant Examiner*—Trinh Vo Dinh

(57) ABSTRACT

A LED that includes a light emitter that emits light of a first wavelength and a phosphor layer that converts a portion of that light to light of a second wavelength is disclosed. The phosphor layer includes a powdered phosphor suspended in a photo-curable medium that sets upon exposure to light of a curing wavelength. The phosphor layer can also include a thixotropic agent that reduces the rate at which the powdered phosphor settles in the medium prior to the medium being exposed to light of the curing wavelength. The photo-curable medium preferably includes a photo-curable epoxy that cures in a time that is short compared to the settling time of the phosphor powder in the medium.

4 Claims, 1 Drawing Sheet

METHOD FOR MAKING AN LED

FIELD OF THE INVENTION

The present invention relates to light-emitting diodes.

BACKGROUND OF THE INVENTION

For the purposes of the present discussion, the present invention will be discussed in terms of a "white" emitting light-emitting diode (LED); however, the methods taught in the present invention can be applied to wide range of LEDs. A white emitting LED that emits light that is perceived by a human observer to be "white" can be constructed by making a LED that emits a combination of blue and yellow light in the proper ratio of intensities. High intensity blue-emitting LEDs are known to the art. Yellow light can be generated from the blue light by converting some of the blue photons via an appropriate phosphor. In one design, a transparent layer containing dispersed particles of the phosphor covers a LED chip. The phosphor particles are dispersed in a potting material that surrounds the light-emitting surfaces of the blue LED. To obtain a white emitting LED, the thickness and uniformity of the dispersed phosphor particles must be tightly controlled.

In one design, the LED is mounted on a heat sink in a well in a printed circuit board base. The well has reflective sides that form a reflective "cup" having the LED chip at the bottom thereof. The phosphor is mixed with a liquid casting epoxy and injected into the cup. The part is then heat-cured for 2 hours.

Unfortunately, this manufacturing system has a poor yield due to uneven phosphor dispersion in the reflecting cup. The density of the phosphor particles is larger than that of the liquid casting epoxy, and hence, the particles tend to settle toward the bottom of the reflector cup. As a result, the amount of phosphor over the chip is reduced, which, in turn, lowers the ratio of yellow to blue light generated by the completed device. Such a device emits light that is bluish-white rather than white.

In addition, the liquid casting epoxy tends to shrink during the heat curing process. This can leave a part in which the top of the chip is exposed. This also leads to a color shift that is undesirable.

SUMMARY OF THE INVENTION

The present invention is a LED that includes a light emitter that emits light of a first wavelength and a phosphor layer that converts a portion of that light to light of a second wavelength. The phosphor layer includes a powdered phosphor suspended in a photo-curable medium that sets upon exposure to light of a curing wavelength. The phosphor layer can also include a thixotropic agent that reduces the rate at which the powdered phosphor settles in the medium prior to the medium being exposed to light of the curing wavelength. The photo-curable medium preferably includes a photo-curable epoxy that cures in a time that is short compared to the settling time of the phosphor powder in the medium.

DETAILED DESCRIPTION OF THE PREFERRED EMBODIMENTS OF THE INVENTION

Figure 1:
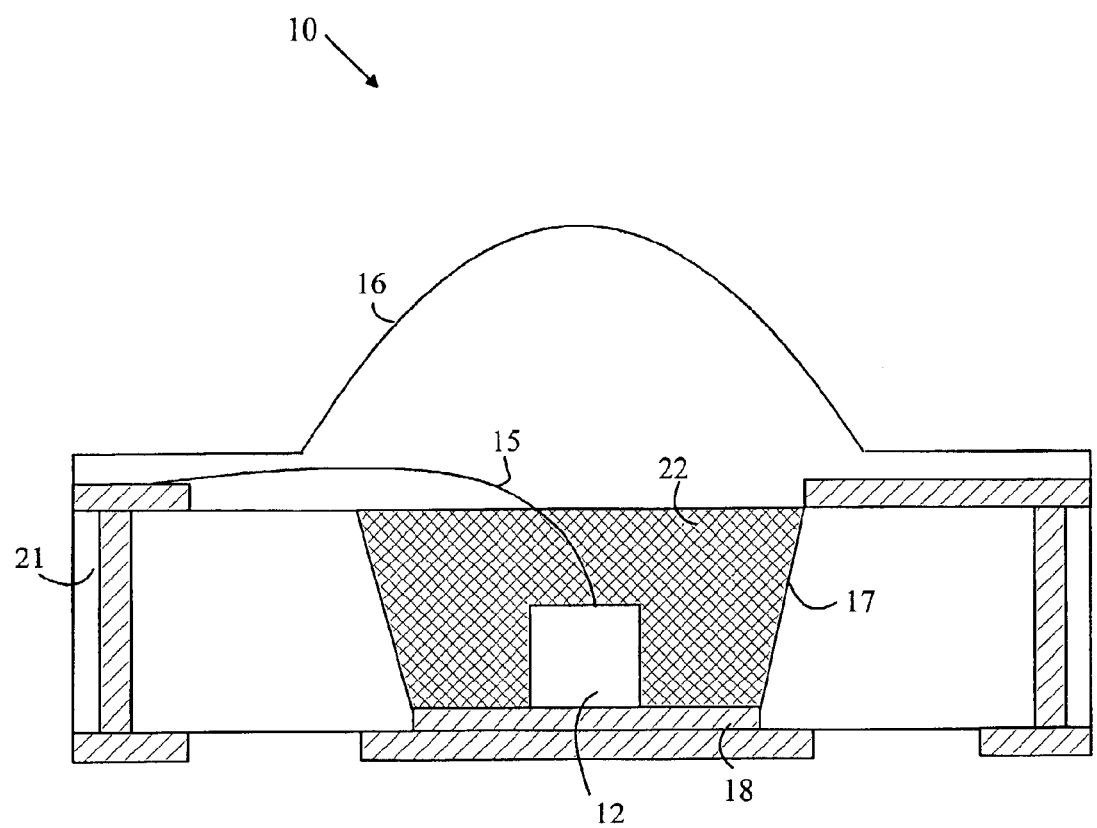
FIG. 1 is a cross-sectional view of a completed white-emitting LED 10.

The present invention overcomes the above-described problems by reducing the sedimentation of the phosphor particles. The preferred embodiment of the present invention utilizes a UV cured epoxy that sets in a very short period of time together with a thixotropic agent that retards the sedimentation of the phosphor particles.

The manner in which the present invention provides its advantages can be more easily understood with reference to FIG. 1, which is a cross-sectional view of a completed white-emitting LED 10. LED 10 includes a reflecting cup 17 constructed in a well in a printed circuit board base. The blue-emitting LED semiconductor chip 12 is mounted on a heat sink 18 that covers the bottom of cup 17. Cup 17 is filled with a casting epoxy 22 in which the phosphor particles are suspended. In the preferred embodiment of the present invention, the phosphor particles have a mean particle diameter of 4 $\mu$m or greater and are uniformly dispersed in the epoxy medium. Electrical connection is made to the top surface of chip 12 via wire 15, which connects to an electrical via 21. The second connection to chip 12 is made through the bottom of the chip. To simplify the drawing, this connection has been omitted. An optical dome 16 is placed over the encapsulated chip to control the manner in which the light is extracted.

The preferred phosphor composition comprises particles of a metal aluminum oxide having a mean diameter that is greater than 4 $\mu$m. Since phosphors for use in constructing white-emitting LEDs are known to the art, they will not be discussed in detail here. For example, U.S. Pat. No. 6,501,100 describes a phosphor system for constructing white LEDs. This material is suspended in a UV curable epoxy resin containing a thixotropic agent that allows the gelatinous composition to be injected into the reflective cups prior to curing with UV light. The preferred epoxy resin is a one part composition having cycloaliphatic, novolac, Bisphenol A, UVI 6990, UVI 6074, and photo-initiators. These materials can be purchased commercially from Union Carbide or Dow Chemicals. The compositions are set such that the epoxy cures in 2–4 seconds when exposed to a UV light source in 320–390 nm range at an intensity of 1–2 J/cm$^2$. Suitable thixotropic agents may be obtained from Degussa AG, Aerosil & Silanes, Produktsicherheit AS-FA-PS, Postfach 1345, D-63403 Hanau, Germany (Aerosil 130, Aerosil 150, Aerosil 200, Aerosil 300, Aerosil 380, Aerosil R202, Aerosil R805, Aerosil R812, Aerosil R812S, Aerosil R816, Aerosil R972, and Aerosil R974). Additional thixotropic agents suitable for use in the present invention can be obtained from Cabot Corporation, Cab-O-Sil Division, 700E. U.S. Highway 36, Tuscola, Ill. 61953-9643 (CAB-O-SIL TS-530, CABO-O-SIL TS-610, CABO-O-SIL TS-720, CAB-O-SIL LM-130, CAB-O-SIL LM-150, CAB-O-SIL M-5, CAB-O-SIL M-5P, CAB-O-SIL MS-55, CAB-O-SIL H-5). The concentration of the thixotropic agents depends on the particular agent chosen; however, in general, these agents are utilized at concentrations of less than 30%.

The fast curing time together with the thixotropic agent assures that the epoxy sets before the phosphor particles can settle to the bottom of the reflective cup. Hence, the problems associated with particle settling are substantially reduced. In addition, the shorter cure time increases the throughput of the production line, and thus, reduces manufacturing costs. The one part epoxy resin also eliminates human errors in the mixing of the previously used two-part heat cured system. Finally, the problems associated with the shrinkage of the epoxy material are substantially reduced by this epoxy composition.

The above-described embodiments of the present invention utilize a very fast setting epoxy. However, it should be noted that the present invention will operate satisfactorily with any epoxy in which the setting time is small compared to the time that is required for the powdered phosphor to settle sufficiently to alter the concentration of the phosphor in the resin layer above the chip containing the LED. As long as the concentration of the phosphor in the layer does not change by more than during the curing the process, the present invention provides a significant advantage over prior art systems.

Various modifications to the present invention will become apparent to those skilled in the art from the foregoing description and accompanying drawings. Accordingly, the present invention is to be limited solely by the scope of the following claims.

What is claimed is:

1. A light source comprising:
    a light emitter that emits light of a first wavelength; and
    a phosphor layer covering said light emitter, said phosphor layer converting a portion of said light emitter of said first wavelength to light of a second wavelength, wherein, said phosphor layer comprises a powdered phosphor suspended in a photo-curable medium that sets upon exposure to light of a curing wavelength,
    wherein said photo-curable medium sets in a time less than that required for a change in concentration of said phosphor in said phosphor layer over said LED of more than 0.5 percent.

2. A light source comprising:
    a light emitter that emits light of a first wavelength; and
    a phosphor layer covering said light emitter, said phosphor layer converting a portion of said light emitter of said first wavelength to light of a second wavelength, wherein, said phosphor layer comprises a powdered phosphor suspended in a photo-curable medium that sets upon exposure to light of a curing wavelength,
    wherein said phosphor layer further comprises a thixotropic agent that reduces a rate at which said powdered phosphor settles in said photo-curable medium prior to said photo-curable medium being exposed to said light of said curing wavelength.

3. A method for fabricating a LED comprising:
    mounting a LED that emits light of a first wavelength on a substrate;
    suspending a powder of a phosphor that converts light of said first wavelength to light of a second wavelength in a photo-curable material that sets upon exposure to light of a curing wavelength;
    covering said LED with a laser of said photo-curable medium; and
    exposing said photo-curable medium to light of said curing wavelength,
    wherein said photo-curable medium sets in a time less than that required for a change in concentration of said phosphor in said phosphor layer over said LED of more than 0.5 percent.

4. A method for fabricating a LED comprising:
    mounting a LED that emits light of a first wavelength on a substrate;
    suspending a powder of a phosphor that converts light of said first wavelength to light of a second wavelength in a photo-curable material that sets upon exposure to light of a curing wavelength;
    covering said LED with a layer of said photo-curable medium; and
    exposing said photo-curable photo-curable medium to light of said curing wavelength,
    wherein said photo-curable medium further comprises a thixotropic agent that reduces a rate at which said powdered phosphor settles in said photo-curable medium prior to said photo-curable medium being exposed to said light of said curing wavelength.

* * * * *